United States Patent [19]
Amini et al.

[11] Patent Number: 5,938,943
[45] Date of Patent: Aug. 17, 1999

[54] NEAR SUBSTRATE REACTANT HOMOGENIZATION APPARATUS

[75] Inventors: Zahra H. Amini, Cupertino, Calif.; Robert B. Campbell, Tijeras, N.Mex.; Robert L. Jarecki, Jr.; Gary D. Tipton, both of Albuquerque, N.Mex.

[73] Assignee: Applied Materials, Inc., Santa Clara, Calif.

[21] Appl. No.: 08/508,724

[22] Filed: Jul. 28, 1995

[51] Int. Cl.$^6$ ..................................... H05H 1/00
[52] U.S. Cl. .............................. 216/67; 216/58; 438/706; 438/710; 156/345
[58] Field of Search ................................ 156/643.1, 345; 118/724, 725, 728, 723 E; 216/58, 67, 71; 204/298.31; 438/706, 710, 714

[56] References Cited

U.S. PATENT DOCUMENTS

| | | | |
|---|---|---|---|
| 4,350,578 | 9/1982 | Frieser et al. | 204/298.31 X |
| 4,786,359 | 11/1988 | Stark et al. | 156/643.1 |
| 4,793,975 | 12/1988 | Drage | 156/345 X |
| 5,356,476 | 10/1994 | Foster et al. | 118/728 X |
| 5,384,008 | 1/1995 | Sinha et al. | 118/728 X |
| 5,415,728 | 5/1995 | Hasegawa et al. | 156/345 X |

FOREIGN PATENT DOCUMENTS

| | | |
|---|---|---|
| 61-39520 | 2/1986 | Japan . |
| 62-47130 | 2/1987 | Japan . |
| 5-243190 | 9/1993 | Japan . |

*Primary Examiner*—Thi Dang
*Attorney, Agent, or Firm*—Michael A. Glenn; Peter J. Sgarbossa; James C. Wilson

[57] ABSTRACT

A near substrate reactant homogenization apparatus reduces the excess reactive species in a region at or near the edge of a substrate surface to provide a uniform reactant concentration over the substrate, thereby improving etch rate uniformity over the substrate. The near substrate reactant homogenization apparatus has a substantially planar surface that is parallel to said substrate surface and that extends beyond the substrate edge, at or below the substrate surface. In a first preferred embodiment of the invention, the temperature of the gas absorber area is changed to promote recombination or condensation of excess reactive species at the substrate edge, where the excess species are removed. In another, equally preferred embodiment of the invention, the gas absorber area is formed of a porous material having a large surface area. Excess reactive species enter the porous structure and are subsequently recombined. In a third equally preferred embodiment of the invention, a gas curtain of a laminar inert or reactive gas may also be used along the substrate surface perimeter, either alone or in conjunction with the first or second embodiments of the invention, to form a diffusive barrier that suppresses the flux of excess reactive species at the substrate's edge.

11 Claims, 3 Drawing Sheets

NEAR SUBSTRATE REACTANT HOMOGENIZATION APPARATUS

BACKGROUND OF THE INVENTION

TECHNICAL FIELD

The invention relates to substrate fabrication. More particularly, the invention relates to an apparatus and method for providing a uniform distribution of reactive species over a substrate.

DESCRIPTION OF THE PRIOR ART

During the fabrication of integrated circuits on a silicon wafer, the wafer is coated with a photoresist mask, portions of which are exposed to light and developed to form a pattern on the wafer surface. A plasma containing a reactive gas is then applied to etch the coated wafer. The steps of coating, patterning, and etching may be repeated several times during the fabrication process.

FIG. 1 is a diagram showing the concentration of reactive species during substrate etching relative to the surface of a semiconductor wafer. Reactive species generated from a process gas are applied to the surface of a silicon wafer to expose portions of the wafer surface not coated with a photoresist to the reactive species, such that a desired pattern is etched into the wafer surface.

The etching rate increases with the concentration of reactive species. Due to consumption of reactive species at the wafer surface, the flux of this material has a non-uniform distribution over the etching surface, as shown by the lines identified by the numeric designators 110 and 120. Thus, a region of uniformity 140 occurs toward the center of the wafer 220, while a region of non-uniformity 180 containing excess reactive species occurs toward the edge 160 of the wafer. The region of nonuniformity typically has an increased etch rate.

It is important to maintain a uniform etch rate over the surface of the wafer to ensure the accurate patterning of the wafer surface. Reduction of reactive species at the wafer's edge is one way to achieve this uniformity. The prior art method for reducing this excess reactive species radial flux is to use a focus ring 225 surrounding the wafer, as is shown in FIG. 2. The focus ring forms a diffusive barrier that suppresses the flux of excess reactive species at the wafer's edge.

There are, however, several significant problems arising from the use of a focus ring. The focus ring can introduce contamination during the etching process that may degrade the wafer etching yields, and the subsequent performance of the integrated circuits thus produced. For example, the focus ring itself can react with the reactive species and provide a surface for deposition of by-product. Further, delamination of the films could occur due to poor thermal control and plasma exposure.

Another problem encountered with use of a focus ring is that it makes the insertion and removal of wafers more complex. This slows down the manufacturing process, adding to the cost of production. Further, the likelihood of mishandling and damaging wafers is also increased. It has also been noted that the use of a focus ring distorts the plasma sheath because the electrical field must be perpendicular to the surfaces of the focus ring.

It is also known to use an absorbing annulus to reduce excess reactive species flux. An absorbing annulus is a virtual wafer placed around the periphery of a substrate that is undergoing etching. The absorbing annulus simulates a wafer, thereby consuming excess reactive species, and thereby providing a more uniform etch rate. Unfortunately, the materials used thus far do not produce sufficient effect to improve rate uniformity. Furthermore, the use of certain reactive species, such as silicon, tends to increase the possibility of introducing contamination. Because the annulus is consumable it must be replaced periodically.

It would therefore be a significant advance in the art to provide an apparatus for reducing excess reactive species at the edge of a substrate during etching. It would be a further advance if such an apparatus did not introduce contamination into the fabrication process, and did not increase the difficulty of substrate handling.

SUMMARY OF THE INVENTION

The invention provides an apparatus for reducing excessive reactive species at the edge of a substrate during etching, thereby improving etch rate uniformity across the substrate. A sacrificial gas absorber area that extends beyond the edges of a substrate includes an absorber surface that is at or below the surface of the substrate. In a first preferred embodiment of the invention, the temperature of the gas absorber area is lowered or elevated by standard methods, thereby providing enhanced condensation or recombination of excess reactive species at the substrate edge.

In another equally preferred embodiment of the invention, the gas absorber area is formed of a porous material having a large surface area. Excess reactive species are recombined within the porous structure of the area. The removal of the excess reactive species provides a uniform reactant concentration across the substrate, and thus, a uniform etch rate.

In a third equally preferred embodiment of the invention, a boundary curtain of a laminar inert or reactive gas is emitted from a narrow slot along the perimeter of the substrate to form a diffusive barrier that suppresses the flux of excess reactive species at the substrate's edge.

DETAILED DESCRIPTION OF THE INVENTION

The invention provides an apparatus for reducing the excess reactive species at the edge of a substrate during etching, thereby improving etch rate uniformity over the substrate surface.

Figure 1:
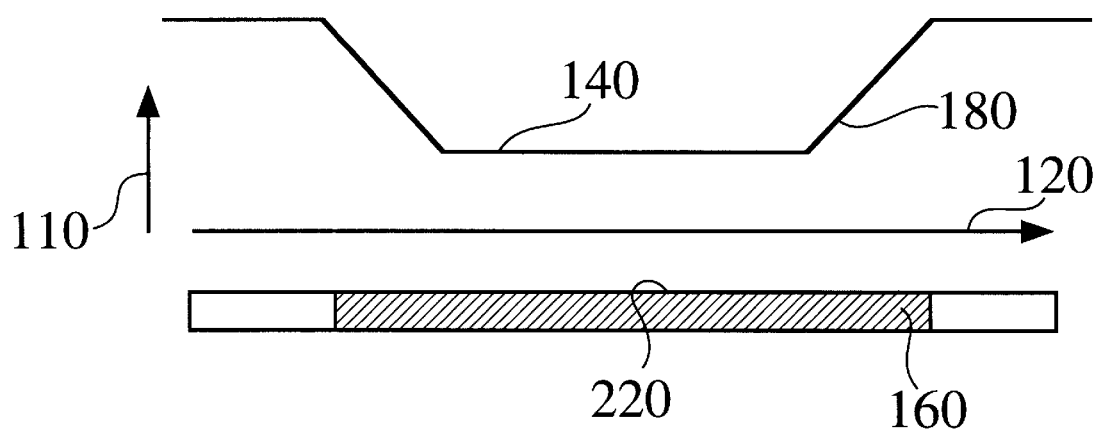
FIG. 1 is a diagram showing the concentration of reactive species during substrate etching relative to the surface of a semicondcutor wafer.
Figure 2:
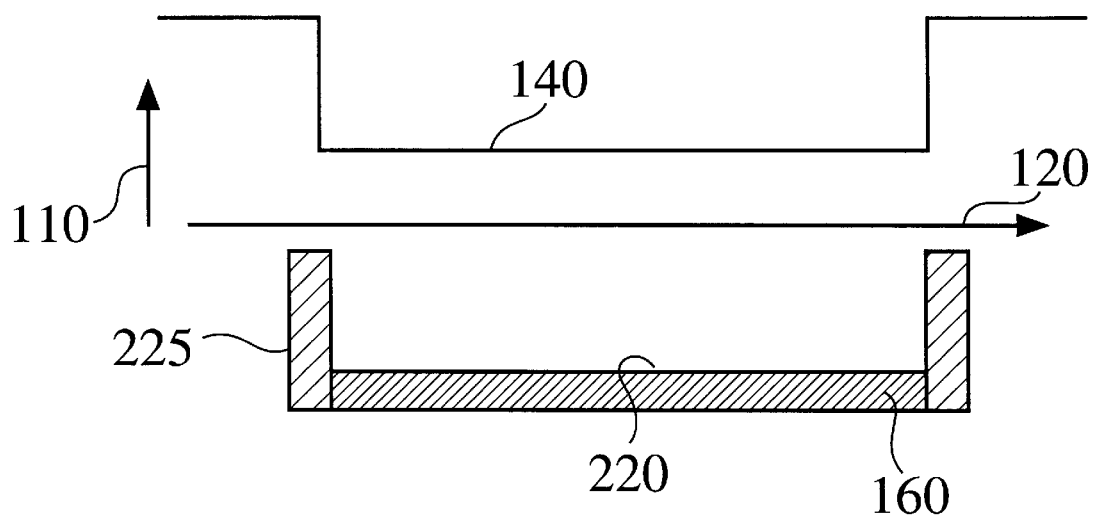
FIG. 2 is a schematic diagram showing the concentration of reactive species during substrate etching with a focus ring as diffusion barrier.
Figure 3:
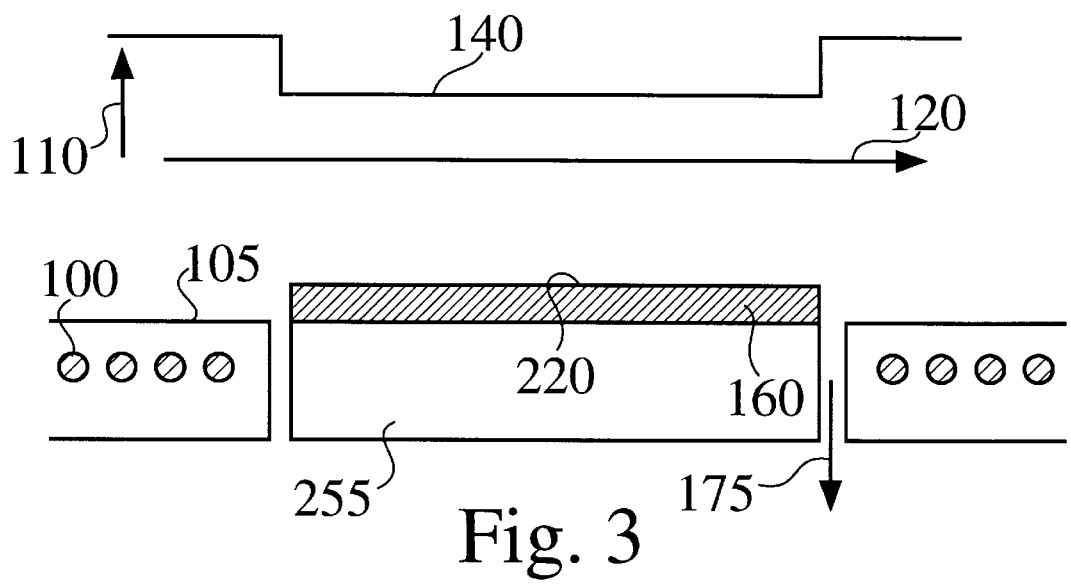
FIG. 3 is a schematic diagram of a near substrate reactant homogenization apparatus according to a first preferred embodiment of the invention.

FIG. 3 is a schematic diagram of a near substrate reactant homogenization apparatus according to a first preferred embodiment of the invention. A near substrate reactant homogenization apparatus has an absorber area 105 that is parallel to, and at or below, the surface of a substrate. In one embodiment of the invention, this absorber area is substantially planar. The surface of the absorber area radially extends beyond the edge 160 of the substrate surface. The radial extent of the absorbing area must be sufficient to confine the region of species non-uniformity to beyond the substrate perimeter. This would, for example, typically require the surface of the absorber area to extend radially approximately a few centimeters beyond the perimeter of a 200 mm substrate.

Because the absorber area is at or below the substrate surface, it does not share the focus ring's drawback of being a source of damaging particles. The absorber area may be at any distance below the substrate surface provided it is not below the substrate lower surface.

In a first preferred embodiment of the invention, the temperature of the gas absorber area is reduced to a temperature consistent with condensation of the reactive species, and should therefore be lower than the substrate temperature. This low temperature enhances condensation of the excess reactive species at the substrate edge. In addition, for certain gases and materials, chemical recombination is enhanced by elevating the temperature of the gas absorbing area.

The temperature level of the gas absorber area is controlled to meet the requirements of the particular etching process. The temperature level of the absorber area is controllably reduced or elevated by means such as a heat channel exchanger 100, or by circulation of a cooled or heated liquid or mixed phase fluid under the absorber area (not shown). In either case, the fluid is thermally isolated from the substrate and substrate platform 255 by vacuum 175 or other isolation means.

The excess reactive species concentration of the non-uniform region is drawn out from the edge of the substrate and over the cooled gas absorber area, where condensation occurs. The uniform region of reactive species extends from the interior of the substrate 220 to encompass the substrate's edge 160.

Alternatively, the gas absorber area is maintained at a reduced temperature that increases the condensation of the excess reactive species on the absorber area surface, or at the elevated temperature to promote recombination. Exemplary temperature ranges are from −100 to 0° C. to promote condensation, and from 50 to 100° to promote recombination. Accordingly, the flux of this material has a uniform distribution over the etching surface, as shown by the lines identified by the numeric designators 110 and 120. Thus, a region of uniformity 140 occurs across the surface of the wafer 220.

Figure 4:
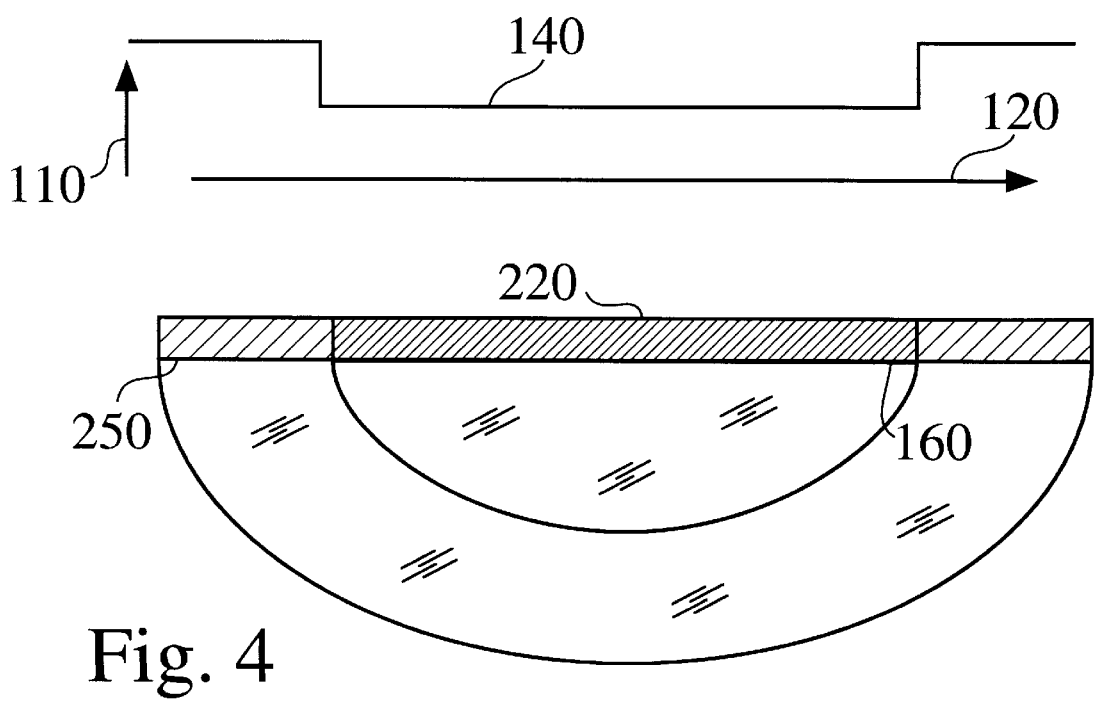
FIG. 4 is a schematic diagram of a near substrate reactant homogenization apparatus according to a second, equally preferred embodiment of the invention.

FIG. 4 is a schematic diagram of a near substrate reactant homogenization apparatus according to a second, equally preferred embodiment of the invention. The gas absorber area is formed of a micro-porous, large surface area material 250. Candidate materials include aluminosilicates, zeolite, and ceramics. Refractory materials are preferred to minimize degradation due to plasma exposure. The pores are preferably between 10μ and 1 mm in diameter. Excess reactive species enter the porous structure, react at the surface of the pores and convert to non-reactive species. The reduction in reactive species concentration at the edge of the substrate therefore provides a uniform concentration over the substrate, and thus, a uniform etch rate. Accordingly, the flux of this material has a uniform distribution over the etching surface, as shown by the lines identified by the numeric designators 110 and 120. Thus, a region of uniformity 140 occurs across the surface of the wafer 220.

Figure 5:
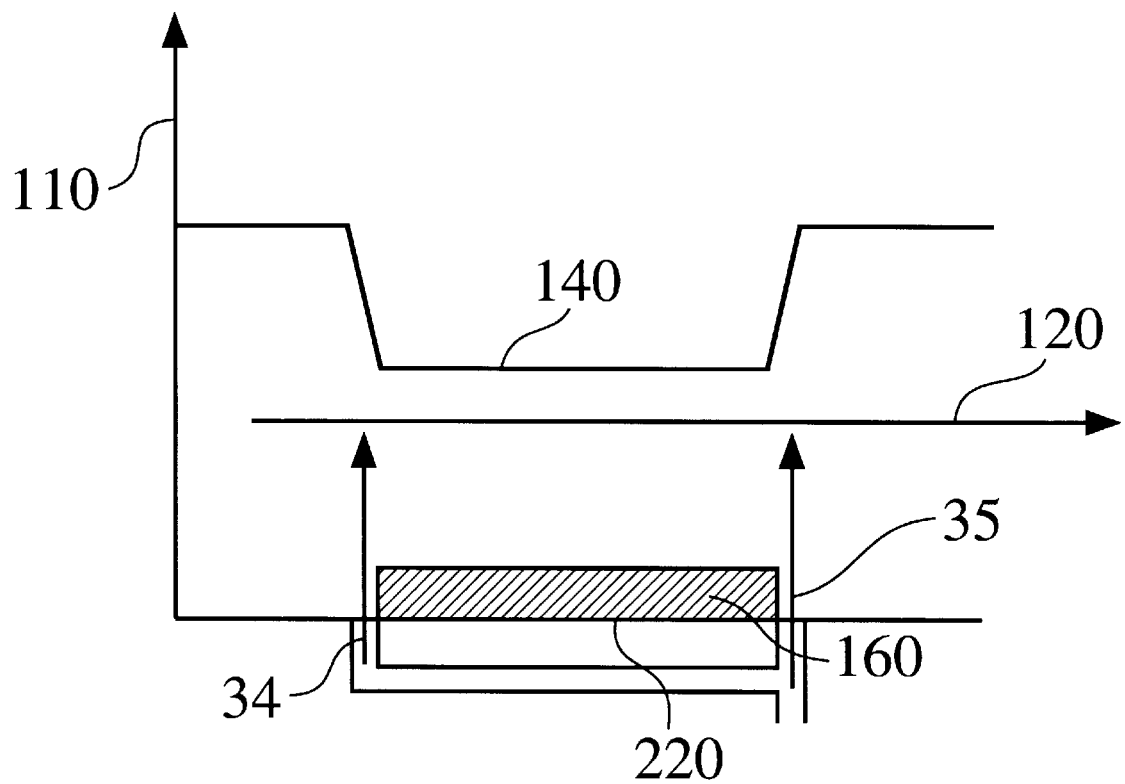
FIG. 5 is a side view of the boundary curtain concept for injection of inert or reactive gases, according to a third equally preferred embodiment of the invention.

In a third, equally preferred embodiment of the invention, shown in FIG. 5, an inert or process gas is introduced through a narrow slot 34 formed around the perimeter of the substrate to form a gas curtain 35. The slot is preferably 0.5 mm to 2 mm in width. This high velocity gas curtain acts as a physical diffusive barrier and should therefore be provided at a flow rate that is sufficient to provide an effective barrier. This rate varies from process to process. The gas curtain is supplied by conventional pumping means as are well known in the art.

Thus, in this embodiment of the invention reactive species are connected vertically away from the substrate before they can diffuse radially across the curtain. Accordingly, the flux of this material has a uniform distribution over the etching surface, as shown by the lines identified by the numeric designators 110 and 120. Thus, a region of uniformity 140 occurs across the surface of the wafer 220.

Although the invention is described herein with reference to the preferred embodiment, one skilled in the art will readily appreciate that other applications may be substituted for those set forth herein without departing from the spirit and scope of the invention. For example, the near substrate reactant homogenization apparatus may be both temperature controlled and formed of a porous large surface area material. Accordingly, the invention should only be limited by the Claims included below.

We claim:

1. A method for reducing excess reactive species at the edge of a substrate surface, comprising the steps of:

providing a near substrate reactant homogenization apparatus having an absorber area parallel to said substrate surface and extending beyond said edge of said substrate, and that is at or below said substrate surface; and maintaining said surface at a controlled temperature for decreasing said excess reactive species at said surface edge of said substrate.

2. The method of claim 1, further comprising the step of introducing a gas flow to form a diffusive barrier to suppress said excess reactive species at said substrate edge.

3. The method of claim 1, further comprising the step of:

maintaining said absorber area surface at a reduced temperature for promoting condensation of said excess reactive species upon said absorber area surface.

4. The method of claim 1, further comprising the step of:

maintaining said absorber area surface at an increased temperature for promoting recombination of said excess reactive species with said absorber surface.

5. A near substrate reactant homogenization apparatus, comprising:

an absorber area for reducing excess reactive species in a region at or near the edge of a substrate surface, said absorber area being substantially parallel to said substrate surface and extending beyond said edge of said substrate, at or below said substrate surface; and means for maintaining said absorber area surface at a controlled temperature for decreasing said excess reactive species at said surface edge of said substrate.

6. The near substrate reactant homogenization apparatus of claim 5, wherein said temperature controlling means is at least one heat channel exchanger in contact with said absorber area.

7. The near substrate reactant homogenization apparatus of claim 5, wherein said gas absorber area is formed of a porous material having a large surface area.

8. The near substrate reactant homogenization apparatus of claim 7, wherein said porous material is a refractory material that may include ceramic, aluminosilicate, or zeolite.

9. The near substrate reactant homogenization apparatus of claim 7, wherein said porous material promotes recombination of excess reactive species at said edge of said substrate.

10. The near substrate reactant homogenization apparatus of claim 5, wherein said absorber area defines at least one slot adapted to introduce a gas curtain at said edge of said substrate.

11. The near substrate reactant homogenization apparatus of claim 10, wherein said gas curtain forms a physical diffusive barrier adapted to suppress said excess reactive species at said substrate edge.

* * * * *